(12) United States Patent
Wang et al.

(10) Patent No.: US 12,348,198 B1
(45) Date of Patent: Jul. 1, 2025

(54) METHOD AND STANDARD MODULE FOR AMPLIFYING PULSED POWER

(71) Applicant: INSTITUTE OF FLUID PHYSICS, CHINA ACADEMY OF ENGINEERING PHYSICS, Sichuan (CN)

(72) Inventors: Lingyun Wang, Sichuan (CN); Jianqiang Yuan, Sichuan (CN); Liangji Zhou, Sichuan (CN); Lin Chen, Sichuan (CN); Hongwei Liu, Sichuan (CN); Weiping Xie, Sichuan (CN); Meng Wang, Sichuan (CN); Hongtao Li, Sichuan (CN); Yi Shen, Sichuan (CN); An He, Sichuan (CN); Jiabin Fu, Sichuan (CN); Ping Jiang, Sichuan (CN); Yuan Li, Sichuan (CN); Bing Wei, Sichuan (CN); Yang He, Sichuan (CN); Chuanjun Feng, Sichuan (CN); Yue Zhao, Sichuan (CN); Jie Wang, Sichuan (CN); Junjun Kang, Sichuan (CN); Zhaohui Zhang, Sichuan (CN)

(73) Assignee: INSTITUTE OF FLUID PHYSICS, CHINA ACADEMY OF ENGINEERING PHYSICS, Mianyang (CN)

( * ) Notice: Subject to any disclaimer, the term of this patent is extended or adjusted under 35 U.S.C. 154(b) by 0 days.

(21) Appl. No.: 19/082,745

(22) Filed: Mar. 18, 2025

Related U.S. Application Data (63) Continuation of application No. PCT/CN2023/087839, filed on Apr. 12, 2023.

(30) Foreign Application Priority Data

Sep. 18, 2022 (CN) .......................... 202211133524.9

(51) Int. Cl.
   *H03F 3/08* (2006.01)
   *H03F 3/21* (2006.01)
   (Continued)

(52) U.S. Cl.
   CPC ................. *H03F 3/21* (2013.01); *H03F 3/08* (2013.01); *H03K 3/57* (2013.01); *H03K 5/1506* (2013.01)

(58) Field of Classification Search
   CPC ....................................................... H03F 3/08
   (Continued)

(56) References Cited

U.S. PATENT DOCUMENTS

2014/0146571 A1    5/2014   Ryoo et al.

FOREIGN PATENT DOCUMENTS

CN        1854756 A    11/2006
CN      104682765 A     6/2015
(Continued)

OTHER PUBLICATIONS

International Search Report issued in corresponding International application No. PCT/CN2023/087839, mailed Jun. 19, 2023.
(Continued)

*Primary Examiner* — Henry Choe
(74) *Attorney, Agent, or Firm* — Daniel M. Cohn (57) ABSTRACT

Disclosed is a method and standard module for amplifying pulsed power. The key point of the technical solution is as follows: a method for amplifying pulsed power is formed by means of the joint action of a LASER mode of a crystal medium, a carrier multiplication amplification mode of a semiconductor medium, and a plasma breakdown amplification mode of a gas medium. Electric power which is amplified is converted into optical power first, the optical power is amplified again, and the amplified optical power is converted into electric power again by a photoelectric con-
(Continued)

version and amplification device. A gas switch is triggered based on a photoconductive switch to generate a timing-synchronized high-power electric pulse. The high-power electric pulse may be directly outputted or distributed in multiple channels to obtain multiple timing-synchronized trigger signals. In combination with pulse charge of a capacitor, multiple timing-synchronized high-power electric pulses are outputted.

10 Claims, 5 Drawing Sheets

(51) Int. Cl.
　　　*H03K 3/57*　　　(2006.01)
　　　*H03K 5/15*　　　(2006.01)
(58) Field of Classification Search
　　　USPC .......................................................... 330/308
　　　See application file for complete search history.

(56)　　　　　　　References Cited

FOREIGN PATENT DOCUMENTS

| CN | 110265854 A | 9/2019 |
| CN | 114826233 A | 7/2022 |
| CN | 115412060 A | 11/2022 |

OTHER PUBLICATIONS

Written Opinion of the International Search Authority in corresponding International application No. PCT/CN2023/087839, mailed Jun. 19, 2023.

FIG. 7

METHOD AND STANDARD MODULE FOR AMPLIFYING PULSED POWER

TECHNICAL FIELD

The present disclosure relates to the technical field of accelerators and pulsed power, and more specifically, to a method and standard module for amplifying pulsed power.

BACKGROUND

There are various methods for generating high-power pulses at present, typically including a Marx generator plus an oil medium pulse forming line, a Marx generator plus a water medium pulse forming line, a linear transformer driver (LTD) technology, and the like. The LTD technology refers to that a standard discharge module is formed by using a plurality of switches and capacitors, and power of a plurality of standard discharge modules is superposed by using a magnetic core isolation technology to output ultra-high power. An LTD standard discharge module is usually constructed by using a gas switch and a complete membrane oil-immersed pulse capacitor. The gas switch is mainly triggered by an electric pulse. The pulse capacitor is mainly charged by direct current. At present, the method for amplifying power for the LTD standard discharge module is mainly carried out by using the gas switch, and using a gas medium as an amplifying medium; and an amplifying mode is mainly streamer discharge to amplify lower power to higher power. By superposing power of LTD standard discharge modules, ultra-high peak power is realized.

The gas switch in an existing high-power pulse generation device is high in electric breakdown and abnormal discharge probability and low in reliability. The small delay time jitter for conducting the gas switch is large, the volume of the standard discharge module is large, and the fast rise time of the outputted current is also slow, so that the reliability of the final pulse output is insufficient.

SUMMARY

To overcome deficiencies in the prior art, an objective of the present disclosure is to provide a method and standard module for amplifying pulsed power. A method for amplifying pulsed power is formed by means of the joint action of a light amplification by stimulated emission of radiation mode of a crystal medium, a carrier multiplication amplification mode of a semiconductor medium, and a plasma breakdown amplification mode of a gas medium. The carrier multiplication amplification mode of the semiconductor medium is cooperated with the light amplification by stimulated emission of radiation mode to amplify and convert the electric power into the optical power and amplify the optical power again. The amplified optical power is converted into electric power again by a photoelectric conversion and amplification device. Based on the plasma breakdown amplification mode of the gas medium, a structural capacitor and a structural inductor oscillating circuit are cooperated with the photoelectric conversion and amplification device to trigger the gas switch rapidly, so as to generate a precise timing-synchronized high-power electric pulse. The high-power electric pulse may be directly outputted or distributed in multiple channels to obtain multiple precise timing-synchronized high-power gas switch trigger signals, so as to output multiple timing-synchronized high-power electric pulses.

The above technical objective of the present disclosure is realized by the following technical solutions:

In a first aspect, the present application provides a method for amplifying pulsed power, amplifying an inputted electric power signal by means of a carrier multiplication amplification mode, a light amplification by stimulated emission of radiation mode, and a plasma breakdown amplification mode according to a timing of a timing control signal to obtain one timing-synchronized high-power electric pulse or multiple timing-synchronized high-power electric pulses, the method specifically including:

acquiring at least two electric power signals, which serve as a first electric power signal and a second electric power signal, respectively; and acquiring at least three timing control signals, which serve as a first timing control signal, a second timing control signal, and a third timing control signal, respectively;

amplifying first electric power based on the first timing control signal by using the carrier multiplication amplification mode of a semiconductor medium, performing electro-optical conversion on the amplified electric power signal to obtain a pump light power signal, driving an electro-optical modulator Q based on the second timing control signal by using the light amplification by stimulated emission of radiation mode of a crystal medium to amplify the obtained pump light power signal, so as to obtain a laser signal, and after splitting, transmitting, and shaping the laser signal, converting the laser signal into an electric signal by using a photoelectric conversion and amplification device; and amplifying second electric power based on the third timing control signal by using the carrier multiplication amplification mode of the semiconductor medium to obtain a high-voltage pulse charge signal, charging a pulse capacitor by using the high-voltage pulse charge signal, and based on a plasma breakdown amplification mode of a gas medium, enabling a structural capacitor and a structural inductor oscillating circuit to cooperate with the electric signal converted from the laser signal to trigger a gas switch to output one timing-synchronized high-power electric pulse or multiple timing-synchronized high-power electric pulses.

In an embodiment, the outputting the multiple timing-synchronized high-power electric pulses specifically includes:

distributing the one timing-synchronized high-power electric pulse in multiple channels to obtain multiple timing-synchronized trigger signals;

amplifying the electric power signal by using the carrier multiplication amplification mode of the semiconductor medium to obtain the high-voltage pulse charge signal; and charging the pulse capacitor by using the high-voltage pulse charge signal, and based on the plasma breakdown amplification mode of the gas medium, triggering the gas switch by using the multiple timing-synchronized trigger signals to output the multiple timing-synchronized high-power electric pulses.

In an embodiment, the trigger signals of the multiple timing-synchronized high-power electric pulses are obtained by superposition and amplification by the gas medium, the semiconductor medium, and the crystal medium by means of the plasma breakdown amplification mode, the carrier multiplication amplification mode, and the light amplification by stimulated emission of radiation mode.

In an embodiment, the control signal for conducting the gas switch which outputs the one timing-synchronized high-power pulse is obtained by converting the light-amplified laser signal into the electric power signal by a photoelectric conversion device and then jointly acting the electric power signal with the gas switch, the structural capacitor, and a structural inductor circuit.

In an embodiment, for amplification processing of the second electric power, the electric power signal is subjected to power amplification processing by using the carrier multiplication amplification mode, then the pulse capacitor is subjected to pulse charge by using the electric power signal with amplified power, and then based on the plasma breakdown amplification mode of the gas medium, the structural capacitor and the structural inductor oscillating circuit are cooperated with the electric signal generated by the photoelectric conversion and amplification device to trigger the gas switch to output the one timing-synchronized high-power electric pulse.

In an embodiment, a voltage is loaded to the gas switch while the switch or the capacitor is subjected to pulse charge by using the electric power signal with the amplified power, a voltage generated by the pulse charge through the structural capacitor of the gas switch is subjected to voltage division to store energy, and under a joint action of the structural inductor oscillating circuit and the electric signal generated by the photoelectric conversion and amplification device, the multiple timing-synchronized gas switch trigger signals are generated to control a backward stage gas switch.

In a second aspect, the present application further provides a standard module for amplifying pulsed power, amplifying an inputted electric power signal by means of a carrier multiplication amplification mode, a light amplification by stimulated emission of radiation mode, and a plasma breakdown amplification mode according to a timing of a timing control signal to obtain one timing-synchronized high-power electric pulse or multiple timing-synchronized high-power electric pulses;

the standard module includes an input module, a light amplification module, a trigger module, and a high-power pulse output module, where the input module is configured to acquire at least two electric power signals, which serve as a first electric power signal and a second electric power signal, respectively; and acquire at least three timing control signals, which serve as a first timing control signal, a second timing control signal, and a third timing control signal, respectively;

the light amplification module is configured to perform electro-optical-electro conversion processing on the first electric power signal to obtain an electric signal;

the trigger module is configured to output one timing-synchronized high-power electric pulse according to the second electric power signal and the electric signal; and the high-power pulse output module is configured to output the multiple timing-synchronized high-power electric pulses according to the one timing-synchronized high-power electric pulse.

In an embodiment, the light amplification module is specifically configured to:

amplify first electric power based on the first timing control signal based on a semiconductor switch and load the amplified electric power signal to a xenon lamp or a laser diode to obtain a pump light power signal; and drive an electro-optical modulator Q based on the second timing control signal by using a light amplification by stimulated emission of radiation mode of a crystal medium to amplify the obtained pump light power signal, so as to obtain a laser signal, and after splitting, transmitting, and shaping the laser signal through optical fiber splitting, couple the laser signal to a photoconductive switch to convert the laser signal into the electric signal.

In an embodiment, the trigger module is specifically configured to:

amplify second electric power based on the third timing control signal by using a semiconductor switch, and boost the second electric power by using a high-voltage transformer to obtain a high-voltage pulse charge signal; and charge a pulse capacitor by using the high-voltage pulse charge signal, and based on a plasma breakdown amplification mode of a gas medium, enable a structural capacitor and a structural inductor oscillating circuit to cooperate with the electric signal to trigger a gas switch to output one timing-synchronized high-power electric pulse.

In an embodiment, the high-power pulse output module is specifically configured to:

distribute the one timing-synchronized high-power electric pulse in multiple channels to obtain multiple timing-synchronized trigger signals; and amplify the one electric power signal or multiple electric power signals by using the semiconductor switch, boost the one electric power signal or multiple electric power signals by using the high-voltage transformer to obtain the high-voltage pulse charge signal, charge the pulse capacitor by using the high-voltage pulse charge signal, and trigger the gas switch through the multiple timing-synchronized trigger signals to output the multiple timing-synchronized high-power electric pulses.

Compared with the prior art, the present disclosure has the following beneficial effects:

1. According to the timing of the control signal, the inputted electric power signal is amplified to obtain the multiple timing-synchronized high-power electric pulses. Based on the plasma breakdown amplification mode of the gas medium, the structural capacitor and the structural inductor oscillating circuit are cooperated with the photoelectric conversion and amplification device to trigger the gas switch rapidly, so as to generate the precise timing-synchronized high-power electric pulse. The high-power electric pulse may be outputted directly or distributed in multiple channels to obtain multiple high-power gas switch trigger signals with precise timings, thereby outputting the multiple timing-synchronized high-power electric pulses.

2. For amplifying each electric power, the electric power is subjected to amplification processing by means of the carrier multiplication amplification mode, and by converting the high voltage loaded to a core device into the pulse (for example, switch), i.e., performing pulse charge, the high voltage withstanding time of the device is shortened, and the reliability of the device is improved.

3. For amplifying each electric power, the electric power is subjected to amplification processing by means of the carrier multiplication amplification mode, and by converting the high voltage loaded to a core device into the pulse (for example, pulse capacitor), i.e., performing pulse charge, the high-voltage withstanding time of the device and an insulating material is shortened, the volume of the device and the inductance and resistance of a loop are reduced, and the power density is improved.

BRIEF DESCRIPTION OF FIGURES

The accompanying drawings described here used to provide a further understanding of the embodiments of the present disclosure constitute a part of the present application, rather than limiting the embodiments of the present disclosure. In the drawings.

DETAILED DESCRIPTION

In order to make the objectives, technical solutions and advantages of the present disclosure more clear, the present disclosure will be further described in detail below with reference to specific embodiments and accompanying drawings. The exemplary implementations of the present disclosure and descriptions thereof are merely used for explaining the present disclosure, and are not intended to limit the present disclosure.

It should be understood that the terms "first" and "second" are merely used for a description purpose rather than being construed as indicating or implying relative importance or implicitly indicating the quantity of indicated technical features. Therefore, a feature limited by "first" or "second" may explicitly or implicitly include one or more of the features. In the description of the present disclosure, "a plurality of" means two or more, unless otherwise explicitly defined.

Figure 1:
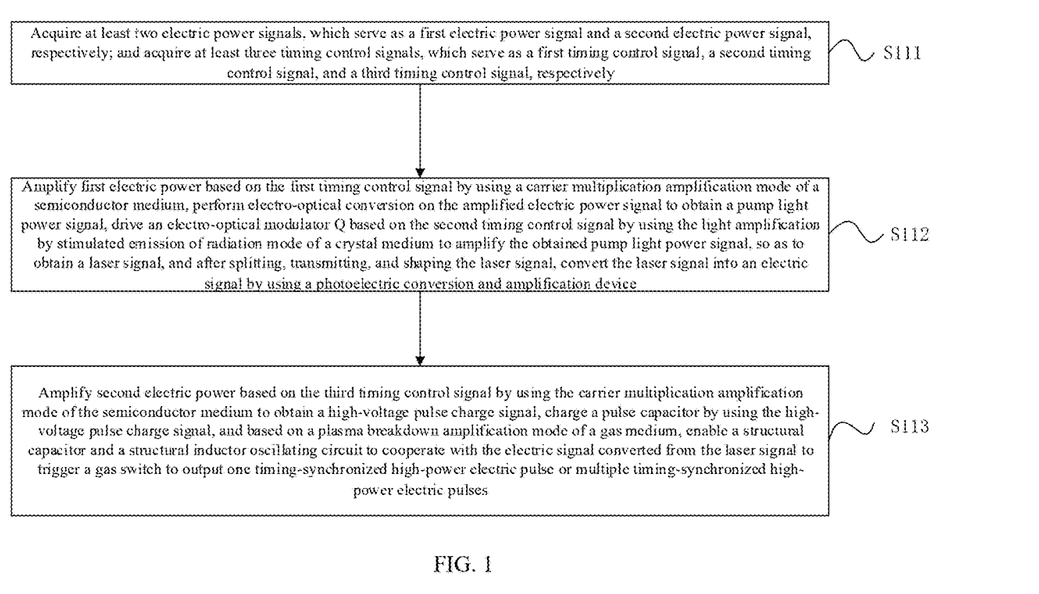
FIG. 1 is a schematic flowchart of a method for amplifying pulsed power provided by an embodiment of the present application.

As shown in FIG. 1, an embodiment of the present application provides a method for amplifying pulsed power, amplifying an inputted electric power signal by means of a carrier multiplication amplification mode, a light amplification by stimulated emission of radiation mode, and a plasma breakdown amplification mode according to a timing of a timing control signal to obtain one timing-synchronized high-power electric pulse or multiple timing-synchronized high-power electric pulses, the method specifically including the following steps:

Step S111: At least two electric power signals are acquired, which serve as a first electric power signal and a second electric power signal, respectively; and at least three timing control signals are acquired, which serve as a first timing control signal, a second timing control signal, and a third timing control signal, respectively.

Step S112: First electric power is amplified based on the first timing control signal by using the carrier multiplication amplification mode of a semiconductor medium. Electro-optical conversion is performed on the amplified electric power signal to obtain a pump light power signal. An electro-optical modulator Q is driven based on the second timing control signal by using the light amplification by stimulated emission of radiation mode of a crystal medium to amplify the obtained pump light power signal, so as to obtain a laser signal. After the laser signal is split, transmitted, and shaped, the laser signal is converted into an electric signal by using a photoelectric conversion and amplification device.

Step S113: Second electric power is amplified based on the third timing control signal by using the carrier multiplication amplification mode of the semiconductor medium to obtain a high-voltage pulse charge signal. A pulse capacitor is charged by using the high-voltage pulse charge signal. Based on a plasma breakdown amplification mode of a gas medium, a structural capacitor and a structural inductor oscillating circuit are cooperated with the electric signal converted from the laser signal to trigger a gas switch to output one timing-synchronized high-power electric pulse or multiple timing-synchronized high-power electric pulses.

Specifically, in step S111, the acquired two electric power signals may be inputted by a low-power power supply, usually with input power of about hectowatt. It should be understood that the acquired two electric power signals in this embodiment are the minimum basic unit, which generate a trigger signal for triggering gas switch conducting. Therefore, in order to meet an actual demand that multiple high-power pulse signals need be generated in an actual application process, multiple electric power signals may be arbitrarily acquired based on the two electric power signals, which are respectively inputted into a trigger pulse amplification circuit, and then the trigger signal serves as a trigger signal for triggering gas switch conducting in the trigger pulse amplification circuit, so as to output multiple high-power pulse signals.

Three control signals with different timings may be outputted by a signal emitter or a signal delay line circuit or the timings of the three control signals are realized by FPGA programming. It should be understood that this has already been quite mature technology, which is not described repeatedly here. It shall be noted that the power of the timing control signal is low. Therefore, when the signal is inputted into a solid medium, for example, a semiconductor switch, a power semiconductor switch, and the like, in order to meet a conducting condition of the solid medium, the power of the timing control signal needs to be amplified through some power driven amplification circuits or devices capable of amplifying the electric power.

Figure 2:
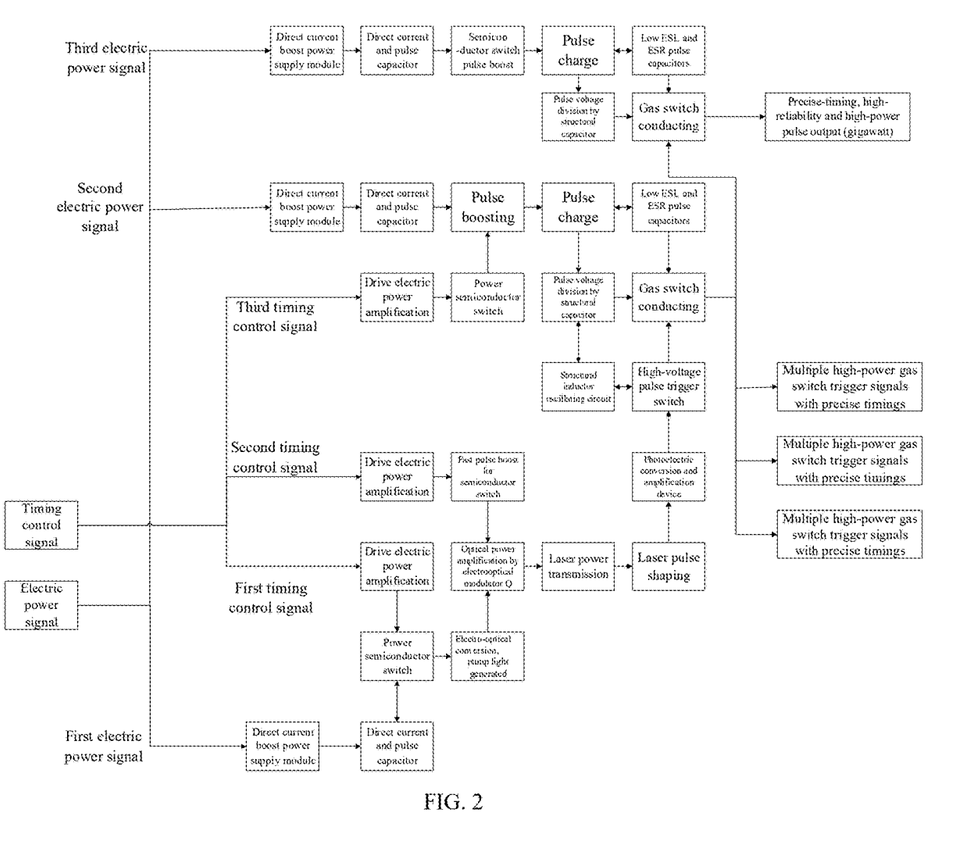
FIG. 2 is a schematic structural diagram of a method for amplifying pulsed power provided by an embodiment of the present application.

In step S112, as shown in FIG. 2, for each electric power signal, the power of the first electric power signal needs to be amplified through a direct current boost power supply module and a direct current and pulser and then the electric power signal is outputted to the power semiconductor switch. As may be known from FIG. 2, the first timing control signal is inputted into one driving electric power amplification device. In step S111, its principle has been narrated in detail, which is not repeatedly described here. It should be understood that the second timing control signal in this embodiment plays a major role in converting the electric power signal into the optical power signal, so as to mainly provide a driving signal to generate the optical power signal. Similarly, the second timing control signal is processed by the driving electric power amplification device, which is not repeatedly described here.

In this embodiment, the crystal medium driving the second timing control signal is a semiconductor switch, its mode is the light amplification by stimulated emission of radiation mode, and its working way is to amplify the power of the optical power signal by means of a particle beam inversion principle, which belongs to the prior art and is not repeatedly explained. It should be understood here that the essence of electro-optical modulation Q of the optical power signal is to amplify the power of the optical power signal, and the obtained laser signal may be equivalent to the optical power signal, with the difference in power. However, a photoelectric conversion processing method that converts the laser signal into the electric signal belongs to the prior art, for example, may be realized by a photoelectric converter, which, therefore, is not repeatedly narrated here. Finally, the converted electric signal serves as the trigger signal of the high-voltage pulse trigger switch, i.e., the electric signal. Specifically, the first electric power is amplified based on the first timing control signal by using the semiconductor switch, and the amplified electric power signal is converted into the pump light power signal through a xenon lamp or a laser diode. Based on the second timing control signal, the pump light power is subjected to precise timing modulation Q amplification by using the crystal medium to obtain a laser signal with higher power. The laser power is split by an optical fiber, and multiple laser signals are generated based on optical fiber transmission and light spot shaping and fed into a photoconductive switch, so that the laser signal is converted into the electric signal.

In step S113, continuously referring to FIG. 2, the pre-processing portion of the second electric power signal is the same as that of the first electric power signal in step S112 in the above embodiment, which is not repeatedly narrated here. For the second electric power, power of hectowatt is amplified to power of kilowatt to ten kilowatts by means of the carrier multiplication amplification mode of the semiconductor medium. In this case, the electric power charges a trigger main loop. After the trigger main loop is fully charged, the photoelectric conversion and amplification device obtains the electric signal and loads the same. The power of tens of kilowatts is amplified to power of hundreds of kilowatts to gigawatt by means of the plasma breakdown amplification mode of the gas medium in the gas switch. In this case, the power may be directly outputted or multiple precise and synchronized next-stage large-scale trigger electric pulses may also be outputted simultaneously. Exemplarily, the second electric power is amplified based on the third timing control signal by using the semiconductor switch, and the pulse is boosted based on a pulse transformer to form the high-voltage pulse charge power. The power charges the pulse capacitor. The charged capacitor is connected to the gas switch and the structural capacitor is formed between an electrode and a trigger electrode of the gas switch. The structural capacitor, together with the connected inductor oscillating circuit and the photoconductive switch, forms a loop. When the photoconductive switch receives a laser power signal, the trigger electrode of the gas switch will generate a high dv/dt high-voltage pulse to trigger the gas switch to enable rapid conducting of the gas switch, so as to directly output one high-power pulse. Multiple high-power pulses with the precise timing may also be outputted in this mode, for triggering a backward high-power gas switch. It should be understood that in this embodiment, the semiconductor switch is used for pre-amplification to generate the pulse charge power. The voltage withstanding time of the gas switch is shortened while the power is amplified, so that the self-breakdown probability of the gas switch is reduced, a lower delay time jitter is acquired, and the reliability of pulsed power amplification is improved.

To sum up, the embodiment of the present application provides a method for amplifying pulsed power. A method for amplifying pulsed power is formed by means of the joint action of the light amplification by stimulated emission of radiation mode of the crystal medium, the carrier multiplication amplification mode of the semiconductor medium, and the plasma breakdown amplification mode of the gas medium. By enabling the semiconductor switch to cooperate with the laser crystal and the like, the electric power which is amplified is converted into the optical power, and the optical power is amplified again. The amplified optical power is converted into electric power again by the photoelectric conversion and amplification device. The gas switch is triggered based on the photoconductive switch to generate precise timing-synchronized high-power electric pulse. The high-power electric pulse may be directly outputted or distributed in multiple channels to obtain multiple high-power gas switch trigger signals with precise timings. In combination with pulse charge of a capacitor, multiple timing-synchronized high-power electric pulses are outputted.

In an embodiment, the outputting the multiple timing-synchronized high-power electric pulses specifically includes the following steps:

The one timing-synchronized high-power electric pulse is distributed in multiple channels to obtain multiple timing-synchronized trigger signals.

The electric power signal is amplified by using the carrier multiplication amplification mode of the semiconductor medium to obtain the high-voltage pulse charge signal.

The pulse capacitor is charged by using the high-voltage pulse charge signal. Based on the plasma breakdown amplification mode of the gas medium, the gas switch is triggered by using the multiple timing-synchronized trigger signals to output the multiple timing-synchronized high-power electric pulses.

Specifically, as shown in FIG. 2, the third electric power signal or more electric power signals may be amplified by using the carrier multiplication amplification mode of the semiconductor medium to obtain the third high-voltage pulse charge signal or more high-voltage pulse charge signals. The high-voltage pulse charge signals charge a low ESR pulse capacitor or a low ESL pulse capacitor. The charge power of the low ESR pulse capacitor and the low ESL pulse capacitor is further amplified based on the multiple high-power gas switch trigger signals with the precise timings by using the plasma breakdown amplification mode of the gas medium, so that one high-power electric pulse or multiple high-power electric pulses with the precise timings and high reliability are outputted. It should be understood that in this embodiment, the semiconductor switch is used for pre-amplification to generate the pulse charge power. The voltage withstanding time of the pulse capacitor is shortened, while the power is amplified, so that the volume of the pulse capacitor is reduced, the ESR and ESL of the pulse capacitor are reduced, the inductance of a discharge loop is reduced, the turn-on time of the outputted power is faster, and the peak power of the standard discharge module is higher.

In an embodiment, the trigger signals of the multiple timing-synchronized high-power electric pulses are obtained by superposition and amplification by the gas medium, the semiconductor medium, and the crystal medium by means of the plasma breakdown amplification mode, the carrier multiplication amplification mode, and the light amplification by stimulated emission of radiation mode.

Specifically, the multiple high-power gas switch trigger signals with the precise timings (the output of the second electric power) are obtained by superposition and amplification by three media (the gas medium, the semiconductor medium, and the crystal medium) by means of three different amplification modes (the plasma breakdown amplification mode, the carrier multiplication amplification mode, and the light amplification by stimulated emission of radiation mode). Therefore, in terms of the power amplification medium, it is different from the principle in a conventional amplification method which mainly amplifies the power by means of the gas medium.

In an embodiment, the control signal for conducting the gas switch which outputs the one timing-synchronized high-power pulse is obtained by converting the light-amplified laser signal into the electric power signal by the photoelectric conversion device and then jointly acting the electric power signal with the gas switch, the structural capacitor, and the structural inductor circuit.

Specifically, in this embodiment, power amplification is performed by using the semiconductor switch, power amplification is performed by using the laser crystal, and photoelectric conversion is performed by using the photoconductive switch. The gas switch is used for post-amplification. The three amplification devices, together with one photoelectric conversion, all are necessary links during the overall pulsed power amplification.

In an embodiment, for amplification processing of the second electric power signal, the electric power signal is subjected to power amplification processing by using the carrier multiplication amplification mode, then the pulse capacitor is subjected to pulse charge by using the electric power signal with amplified power, and then based on the plasma breakdown amplification mode of the gas medium, the structural capacitor and the structural inductor oscillating circuit are cooperated with the electric signal generated by the photoelectric conversion and amplification device to trigger the gas switch to output the one timing-synchronized high-power electric pulse.

Specifically, as shown in FIG. 2, the pulse capacitor is charged based on a high-voltage pulse charge signal, so that the pulse capacitor generates a control signal for triggering or conducting the gas switch, and the high-voltage withstanding time of the pulse capacitor is shortened, which also reduces the electric breakdown and abnormal discharge probability between the pulse capacitor and a dielectric material of the gas switch. Thus, higher reliability of the device is gained. In this way, the direct current undervoltage ratio of the gas switch may be improved greatly (more than 100% direct current undervoltage ratio, and the gas switch works in a pulse undervoltage ratio state), but the self-breakdown probability is reduced greatly, and the delay time jitter is effectively reduced as well.

In an embodiment, a voltage is loaded to the gas switch while the switch or the capacitor is subjected to pulse charge by using the electric power signal with the amplified power, a voltage generated by the pulse charge through the structural capacitor of the gas switch is subjected to voltage division to store energy, and under joint action of the structural inductor oscillating circuit and the electric signal generated by the photoelectric conversion and amplification device, the multiple timing-synchronized gas switch trigger signals are generated to control a backward stage gas switch.

As shown in FIG. 2, in this embodiment, for amplifying each electric power signal, the electric power is subjected to amplification processing by means of the carrier multiplication amplification mode, and by converting the high voltage loaded to a core device into the pulse (for example, the pulse capacitor), i.e., performing pulse charge, the high-voltage withstanding time of the device and an insulating material is shortened, the volume of the device and the inductance and resistance of the loop are reduced, and the power density is improved.

Based on the same inventive concept, an embodiment of the present application further provides a standard module for the method for amplifying pulsed power. Since the principles of the apparatuses that solve the problem are similar to the principle of the method for amplifying pulsed power shown in FIG. 1, reference may be made to the embodiment of the method shown in FIG. 1 or FIG. 2 for the implementation of these apparatuses, and repetition is not repeatedly described. The standard module is configured to amplify an inputted electric power signal by means of a carrier multiplication amplification mode, a light amplification by stimulated emission of radiation mode, and a plasma breakdown amplification mode according to a timing of a timing control signal to obtain one timing-synchronized high-power electric pulse or multiple timing-synchronized high-power electric pulses.

The standard module includes an input module, a light amplification module, a trigger module, and a high-power pulse output module.

The input module is configured to acquire at least two electric power signals, which serve as a first electric power signal and a second electric power signal, respectively; and acquire at least three timing control signals, which serve as a first timing control signal, a second timing control signal, and a third timing control signal, respectively.

The light amplification module is configured to perform electro-optical-electro conversion processing on the first electric power signal to obtain a timing-synchronized electric signal.

The trigger module is configured to output one timing-synchronized high-power electric pulse according to the second electric power signal and the electric signal.

The high-power pulse output module is configured to output the multiple timing-synchronized high-power electric pulses according to the one timing-synchronized high-power electric pulse.

In an embodiment, the light amplification module is specifically configured to:
  amplify first electric power based on the first timing control signal based on a semiconductor switch and load the amplified electric power signal to a xenon lamp or a laser diode to obtain a pump light power signal; and
  drive an electro-optical modulator Q based on the second timing control signal by using a light amplification by stimulated emission of radiation mode of a crystal medium to amplify the obtained pump light power signal, so as to obtain a laser signal, and after splitting, transmitting, and shaping the laser signal through optical fiber splitting, couple the laser signal to a photoconductive switch to convert the laser signal into the electric signal.

In an embodiment, the trigger module is specifically configured to:

amplify second electric power based on the third timing control signal by using a semiconductor switch, and boost the second electric power by using a high-voltage transformer to obtain a high-voltage pulse charge signal; and charge a pulse capacitor by using the high-voltage pulse charge signal, and based on a plasma breakdown amplification mode of a gas medium, enable a structural capacitor and a structural inductor oscillating circuit to cooperate with the electric signal to trigger a gas switch to output one timing-synchronized high-power electric pulse.

In an embodiment, the high-power pulse output module is specifically configured to:

distribute the one timing-synchronized high-power electric pulse in multiple channels to obtain multiple timing-synchronized trigger signals; and amplify the one electric power signal or multiple electric power signals by using the semiconductor switch, boost the one electric power signal or multiple electric power signals by using the high-voltage transformer to obtain the high-voltage pulse charge signal, charge the pulse capacitor by using the high-voltage pulse charge signal, and trigger the gas switch through the multiple timing-synchronized trigger signals to output the multiple timing-synchronized high-power electric pulses.

The standard module for amplifying pulsed power in this embodiment has the following beneficial effects: by enabling the semiconductor switch to cooperate with the laser crystal and the like, the electric power which is amplified is converted into the optical power, and the optical power is amplified again. The amplified optical power is converted into electric power again by the photoelectric conversion and amplification device. The gas switch is triggered based on the photoconductive switch to generate precise timing-synchronized high-power electric power. The high-power electric pulse may be directly outputted or distributed in multiple channels to obtain multiple high-power gas switch trigger signals with precise timings. In combination with pulse charge of the capacitor, multiple timing-synchronized high-power electric pulses are outputted.

Figure 3:
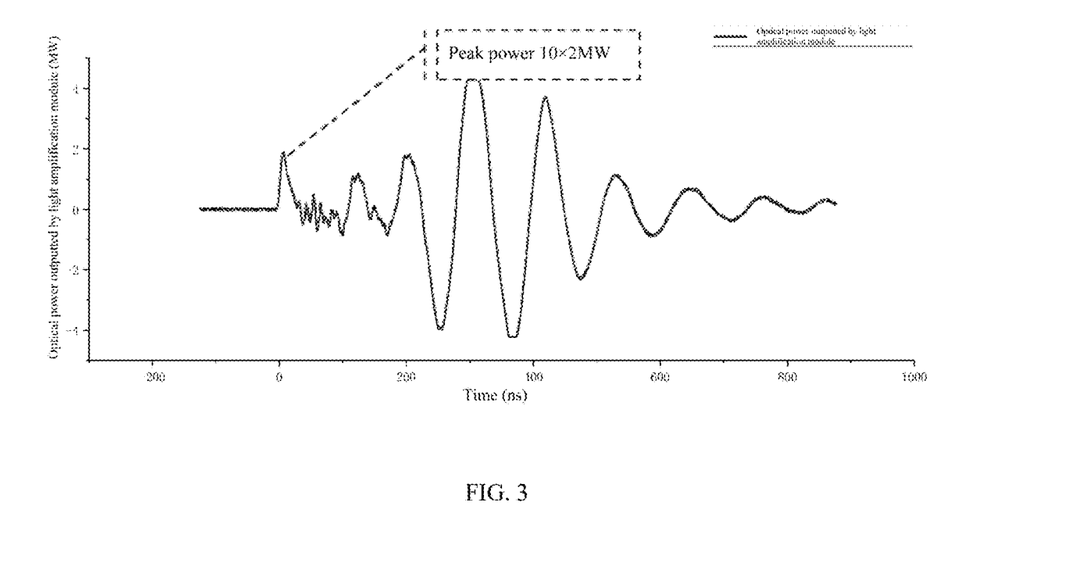
FIG. 3 is an oscillogram of optical power outputted by a light amplification module of a standard module for amplifying pulsed power provided by an embodiment of the present application.

The embodiments of the present application further provide an oscillogram of optical power outputted by the light amplification module, an oscillogram of a voltage outputted by the trigger module, an oscillogram of pulse charge of the capacitor, an oscillogram of a current of the high-power pulse output module, and a power amplification factor diagram of the generated high-power pulse in the pulsed power amplification process, as shown in FIG. 3, FIG. 4, FIG. 5, FIG. 6, and FIG. 7, respectively. In FIG. 3, the electro-optical modulator Q is driven to amplify the obtained pump light power signal based on the second timing control signal by using the light amplification by stimulated emission of radiation mode of the crystal medium to obtain the laser signal, which is 25 MW. The laser signal is subjected to splitting, transmission, and shaping, and each laser signal is 2 MW optical power. That is, the power of the optical power output module is 25 MW, and the trigger optical power of each photoconductive switch is 2 MW.

Figure 4:
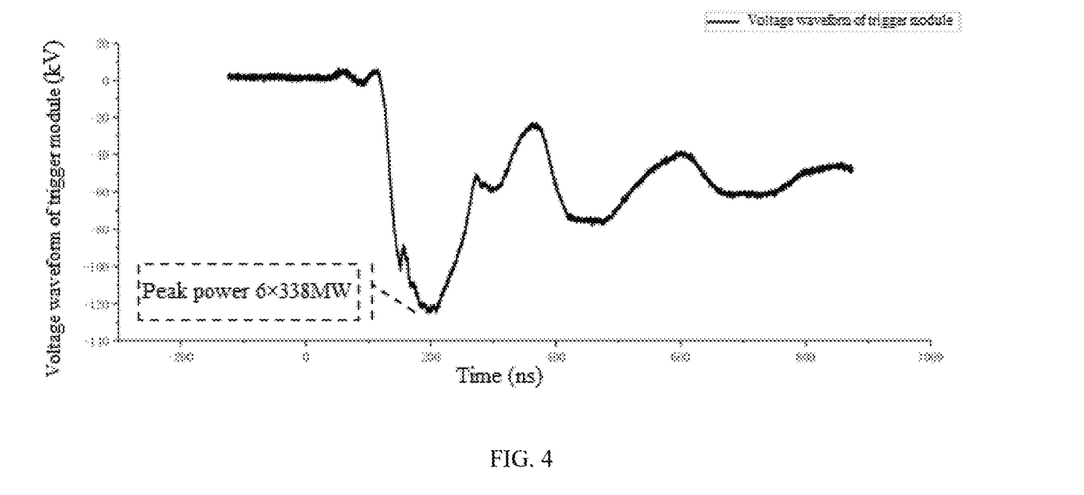
FIG. 4 is an oscillogram of a voltage outputted by a trigger module of a standard module for amplifying pulsed power provided by an embodiment of the present application.

In FIG. 4, based on the plasma breakdown amplification mode of the gas medium, the structural capacitor and the structural inductor oscillating circuit are cooperated with the electric signal converted from the laser signal to trigger the gas switch to output 6 timing-synchronized trigger signals. The electric power of each trigger signal is 338 MW.

Figure 5:
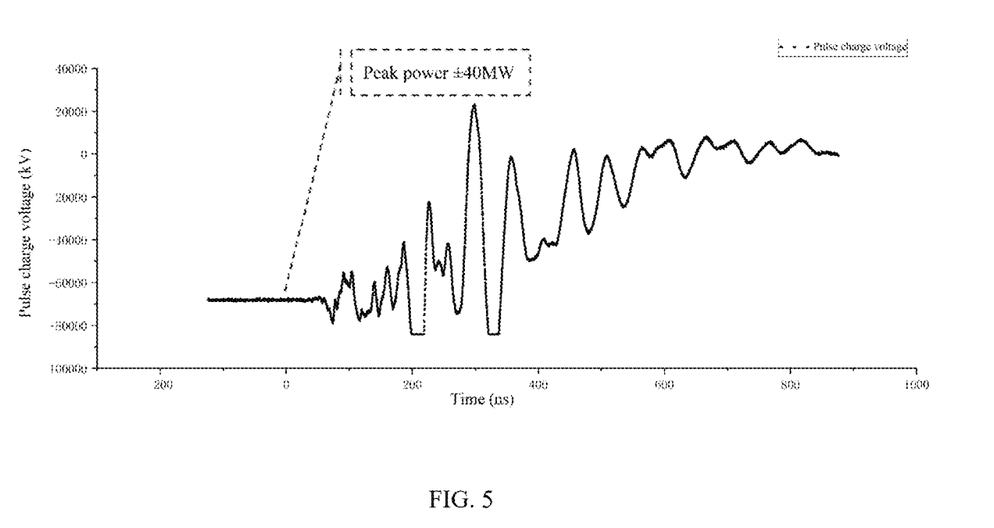
FIG. 5 is an oscillogram of pulse charge of a capacitor provided by an embodiment of the present application.

In FIG. 5, the electric power signal is amplified by using the carrier multiplication amplification mode of the semiconductor medium to obtain the high-voltage pulse charge signal, where the charge power is ±40 MW, the charge voltage is ±69 kV, and the charge time is 13 µs.

Figure 6:
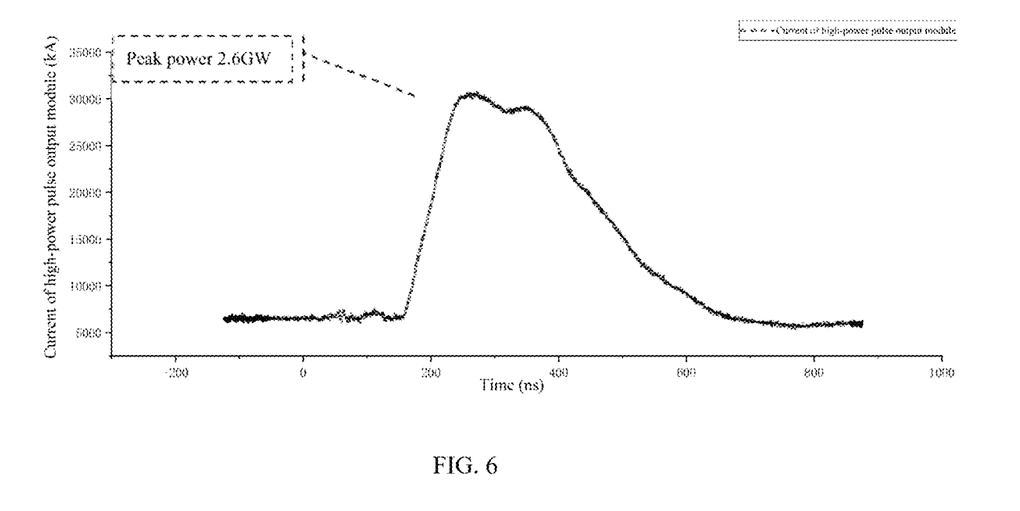
FIG. 6 is an oscillogram of a current of a high-power pulse output module provided by an embodiment of the present application.

In FIG. 6, based on the plasma breakdown amplification mode of the gas medium, the gas switch is triggered by using the multiple timing-synchronized trigger signals to output multiple timing-synchronized high-power electric pulses, with the output power of 2.6 GW, i.e., the one-channel output power of the standard module for discharge is 2.6 GW, the turn-on time is 62 ns, and the delay time jitter between the high-power electric pulse and the optical power signal is 1.98 ns.

Figure 7:
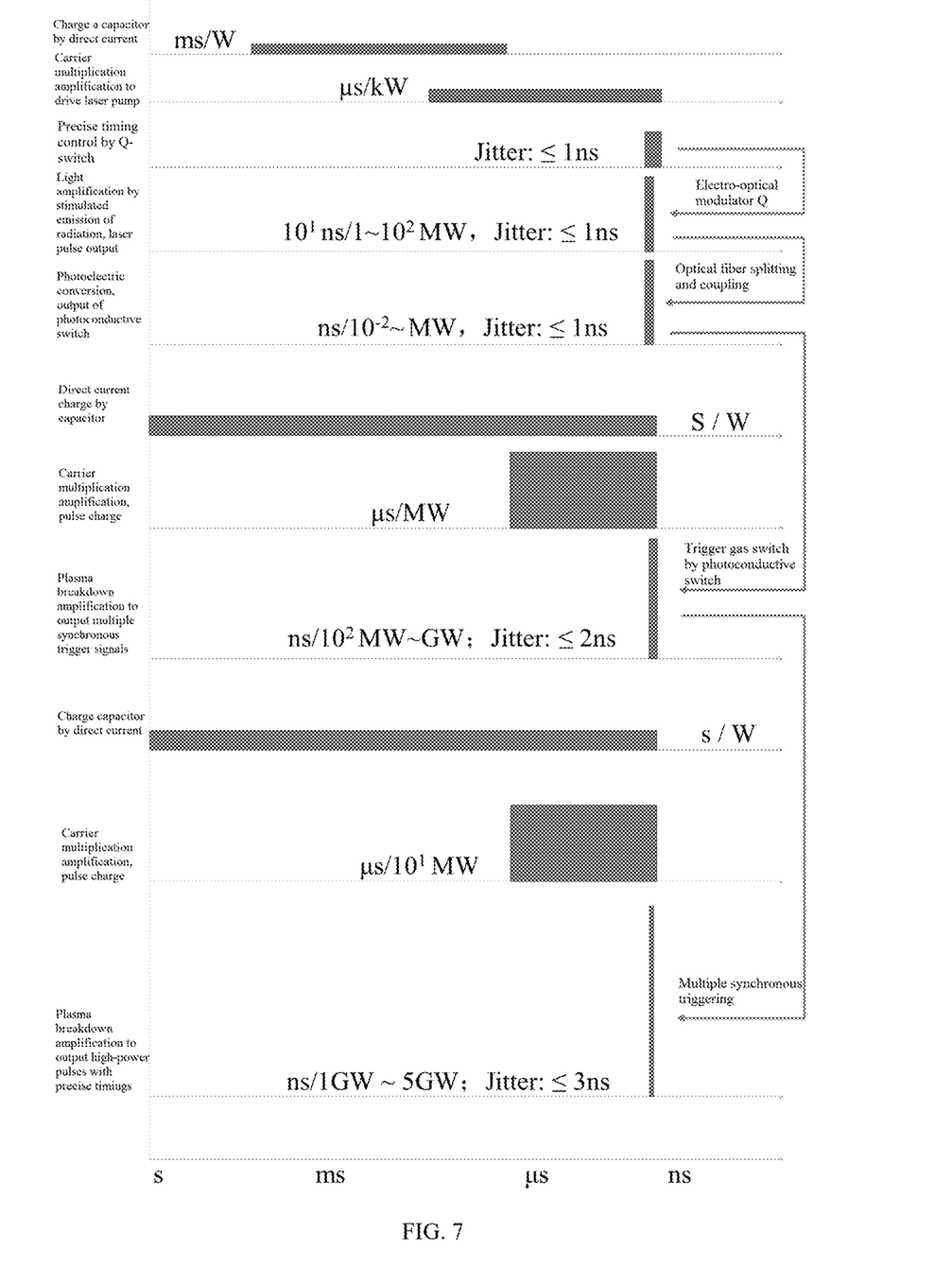
FIG. 7 is a power amplification factor diagram of a generated high-power pulse provided by an embodiment of the present application.

In FIG. 7, the first electric power signal performs direct current charge on the capacitor through a direct current boost module, with the power of several W; and the first timing control signal amplifies the power to several kW through the power semiconductor switch, with the pulse width of hundreds of µs.

The signal drives the electro-optical conversion apparatus, for example, the xenon lamp or the laser diode, to convert the electric power into the optical power, so that the pump light power signal is generated. The second timing control signal amplified and boosted drives the electro-optical modulator Q to amplify the power of the obtained pump light, so as to obtain timing-synchronized optical power of laser of MW to tens of MW, and the optical power is acted to the photoconductive switch device to convert the optical power into the electric power.

The laser signal is split by the optical fiber to form multiple laser signals, and the laser signals are shaped, where the power of the laser signals is $10^{-2}$ MW to MW.

The second electric power signal performs direct current charge on the capacitor through the direct current boost module, with the power of several W.

The third timing control signal is subjected to power amplification to tens of MW through the power semiconductor switch, with the pulse width of tens to hundreds of µs, to perform pulse charge on the capacitor.

The gas switch is triggered by the photoconductive switch to amplify the power of the capacitor, so as to obtain multiple synchronized trigger signals, and the power of each signal is $10^2$ MW to GW.

The third electric power signal performs direct current charge on the capacitor through the direct current boost module, with the power of several W.

The power is amplified to tens of MW through the power semiconductor switch, with the pulse width of tens to hundreds of µs. The pulse capacitor is charged. Based on the gas switch, the gas switch is triggered by using the multiple timing-synchronized trigger signals to output multiple timing-synchronized high-power electric pulses, with the output power of 1-5 GW.

As shown in FIG. 2 to FIG. 7, the method and standard module for amplifying pulsed power provided by the embodiments of the present application may be used for outputting multiple high-power pulses with precise timings.

The specific embodiments described above have further explained the objectives, technical solutions and beneficial effects of the present disclosure in detail. It should be understood that the above is only specific embodiments of the present disclosure, and is not intended to limit the protection scope of the present disclosure. Any modification, equivalent substitution, improvement and the like made within the spirit and principle of the present disclosure shall fall within the protection scope of the present disclosure.

What is claimed is:

1. A method for amplifying pulsed power, amplifying an inputted electric power signal by means of a carrier multiplication amplification mode, a light amplification by stimulated emission of radiation (LASER) mode, and a plasma breakdown amplification mode according to a timing of a timing control signal to obtain one timing-synchronized high-power electric pulse or multiple timing-synchronized high-power electric pulses, the method specifically comprising:

acquiring at least two electric power signals, which serve as a first electric power signal and a second electric power signal, respectively; and acquiring at least three timing control signals, which serve as a first timing control signal, a second timing control signal, and a third timing control signal, respectively;

amplifying first electric power based on the first timing control signal by using the carrier multiplication amplification mode of a semiconductor medium, performing electro-optical conversion on the amplified electric power signal to obtain a pump light power signal, driving an electro-optical modulator Q based on the second timing control signal by using the light amplification by stimulated emission of radiation mode of a crystal medium to amplify the obtained pump light power signal, so as to obtain a laser signal, and after splitting, transmitting, and shaping the laser signal, converting the laser signal into an electric signal by using a photoelectric conversion and amplification device; and amplifying second electric power based on the third timing control signal by using the carrier multiplication amplification mode of the semiconductor medium to obtain a high-voltage pulse charge signal, charging a pulse capacitor by using the high-voltage pulse charge signal, and based on a plasma breakdown amplification mode of a gas medium, enabling a structural capacitor and a structural inductor oscillating circuit to cooperate with the electric signal converted from the laser signal to trigger a gas switch to output one timing-synchronized high-power electric pulse or multiple timing-synchronized high-power electric pulses.

2. The method according to claim 1, wherein the outputting multiple timing-synchronized high-power electric pulses specifically comprises:

distributing the one timing-synchronized high-power electric pulse in multiple channels to obtain multiple timing-synchronized trigger signals;

amplifying the electric power signal by using the carrier multiplication amplification mode of the semiconductor medium to obtain the high-voltage pulse charge signal; and charging the pulse capacitor by using the high-voltage pulse charge signal, and based on the plasma breakdown amplification mode of the gas medium, triggering the gas switch by using the multiple timing-synchronized trigger signals to output the multiple timing-synchronized high-power electric pulses.

3. The method according to claim 2, wherein the trigger signals of the multiple timing-synchronized high-power electric pulses are obtained by superposition and amplification by the gas medium, the semiconductor medium, and the crystal medium by means of the plasma breakdown amplification mode, the carrier multiplication amplification mode, and the light amplification by stimulated emission of radiation mode.

4. The method according to claim 1, wherein the control signal for conducting the gas switch which outputs the one timing-synchronized high-power pulse is obtained by converting the light-amplified laser signal into the electric power signal by a photoelectric conversion device and then jointly acting the electric power signal with the gas switch, the structural capacitor, and a structural inductor circuit.

5. The method according to claim 1, wherein for amplification processing of the second electric power, the electric power signal is subjected to power amplification processing by using the carrier multiplication amplification mode, then the pulse capacitor is subjected to pulse charge by using the electric power signal with amplified power, and then based on the plasma breakdown amplification mode of the gas medium, the structural capacitor and the structural inductor oscillating circuit are cooperated with the electric signal generated by the photoelectric conversion and amplification device to trigger the gas switch to output the one timing-synchronized high-power electric pulse.

6. The method according to claim 5, wherein a voltage is loaded to the gas switch while the switch or the capacitor is subjected to pulse charge by using the electric power signal with the amplified power, a voltage generated by the pulse charge through the structural capacitor of the gas switch is subjected to voltage division to store energy, and under a joint action of the structural inductor oscillating circuit and the electric signal generated by the photoelectric conversion and amplification device, the multiple timing-synchronized gas switch trigger signals are generated to control a backward stage gas switch.

7. A standard module for amplifying pulsed power, amplifying an inputted electric power signal by means of a carrier multiplication amplification mode, a light amplification by stimulated emission of radiation mode, and a plasma breakdown amplification mode according to a timing of a timing control signal to obtain one timing-synchronized high-power electric pulse or multiple timing-synchronized high-power electric pulses;

the standard module comprising an input module, a light amplification module, a trigger module, and a high-power pulse output module, wherein the input module is configured to acquire at least two electric power signals, which serve as a first electric power signal and a second electric power signal, respectively; and acquire at least three timing control signals, which serve as a first timing control signal, a second timing control signal, and a third timing control signal, respectively;

the light amplification module is configured to perform electro-optical-electro conversion processing on the first electric power signal to obtain a timing-synchronized electric signal;

the trigger module is configured to output one timing-synchronized high-power electric pulse according to the second electric power signal and the electric signal; and the high-power pulse output module is configured to output the multiple timing-synchronized high-power electric pulses according to the one timing-synchronized high-power electric pulse.

8. The standard module for amplifying pulsed power according to claim 7, wherein the light amplification module is specifically configured to:

amplify first electric power based on the first timing control signal based on a semiconductor switch and load the amplified electric power signal to a xenon lamp or a laser diode to obtain a pump light power signal; and drive an electro-optical modulator Q based on the second timing control signal by using a light amplification by stimulated emission of radiation mode of a crystal medium to amplify the obtained pump light power signal, so as to obtain a laser signal, and after splitting, transmitting, and shaping the laser signal through optical fiber splitting, couple the laser signal to a photoconductive switch to convert the laser signal into the electric signal.

9. The standard module for amplifying pulsed power according to claim 7, wherein the trigger module is specifically configured to:

amplify second electric power based on the third timing control signal by using a semiconductor switch, and boost the second electric power by using a high-voltage transformer to obtain a high-voltage pulse charge signal; and charge a pulse capacitor by using the high-voltage pulse charge signal, and based on a plasma breakdown amplification mode of a gas medium, enable a structural capacitor and a structural inductor oscillating circuit to cooperate with the electric signal to trigger a gas switch to output one timing-synchronized high-power electric pulse.

10. The standard module for amplifying pulsed power according to claim 7, wherein the high-power pulse output module is specifically configured to:

distributing the one timing-synchronized high-power electric pulse in multiple channels to obtain multiple timing-synchronized trigger signals; and amplify the one electric power signal or multiple electric power signals by using the semiconductor switch, boost the one electric power signal or multiple electric power signals by using the high-voltage transformer to obtain the high-voltage pulse charge signal, charge the pulse capacitor by using the high-voltage pulse charge signal, and trigger the gas switch through the multiple timing-synchronized trigger signals to output the multiple timing-synchronized high-power electric pulses.

* * * * *